Nov. 22, 1960 A. J. GIGER 2,961,553
HIGH SPEED TRANSISTOR SWITCH
Filed June 24, 1959

INVENTOR
A. J. GIGER
BY [signature]
ATTORNEY

United States Patent Office 2,961,553

Patented Nov. 22, 1960

2,961,553

HIGH SPEED TRANSISTOR SWITCH

Adolf J. Giger, Springfield, N.J., assignor to Bell Telephone Laboratories, Incorporated, New York, N.Y., a corporation of New York Filed June 24, 1959, Ser. No. 822,518

8 Claims. (Cl. 307—88.5)

Figure 1:
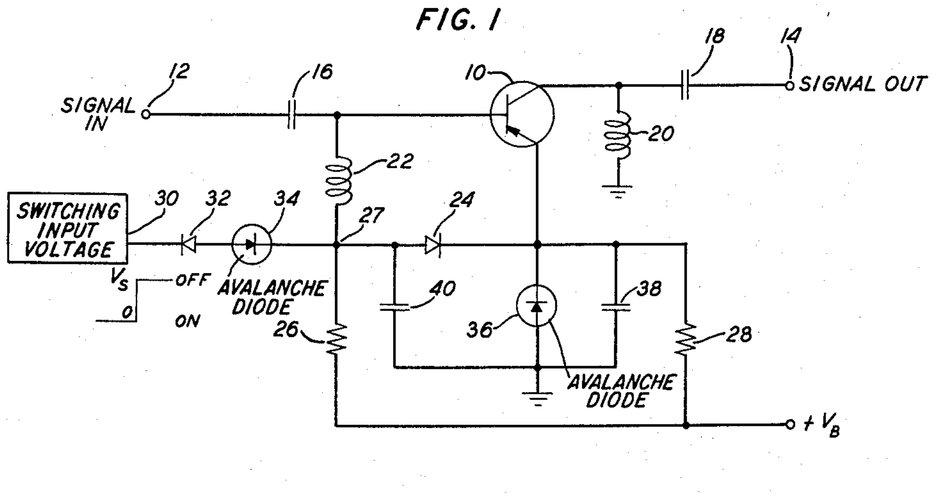

This invention relates to transistor switching circuits and more particularly to a transistor switch having a fast turn-on time and a controlled turn-off time for use in signal gating circuits.

Electronic switching circuits and particularly circuits of this nature empolying semiconductor elements have found wide application in communication and other systems. In the simplest form, these circuits act as a so-called gate which, in response to an external switching signal, may be caused selectively to present either a very low impedance or a substantially infinite impedance between input and output terminals which may be connected in series in a signal path. In a more advanced form, the gate may have gain. Such a gate includes an active amplifying element such as a transistor. In many applications of gate circuits, either with or without gain, the time required for the gate to open to permit transmission between the input and output terminals is of critical importance. Also of importance is the controllability of the time required to close the gate, opening the circuit between the input and output terminals.

It is accordingly the object of the present invention to improve the transient characteristics of gating circuits employing transistors as the gain producing elements and particularly to reduce the turn-on time required for a transistor transmission gate.

In accordance with the above object, the switching or gating circuit of the invention includes a transistor having the usual emitter, base, and collector elements, which is connected in circuit between input and output terminals with one of its elements common to both the input and output circuits. Signals to be switched are applied to an element of the transistor other than that element common to the input and output circuits and the input and common elements are interconnected by means normally applying a cut-off bias to the transistor. A control terminal is provided and is connected to one terminal of the cut-off biasing means by a pair of asymmetrically conducting devices which are connected back-to-back in series and one of which has an avalanche breakdown characteristic. A voltage is applied to the control terminal such that the breakdown voltage of that asymmetrically conducting device is exceeded to remove the cut-off bias and permit transmission between the input and output circuits by way of the transistor.

Figure 2:
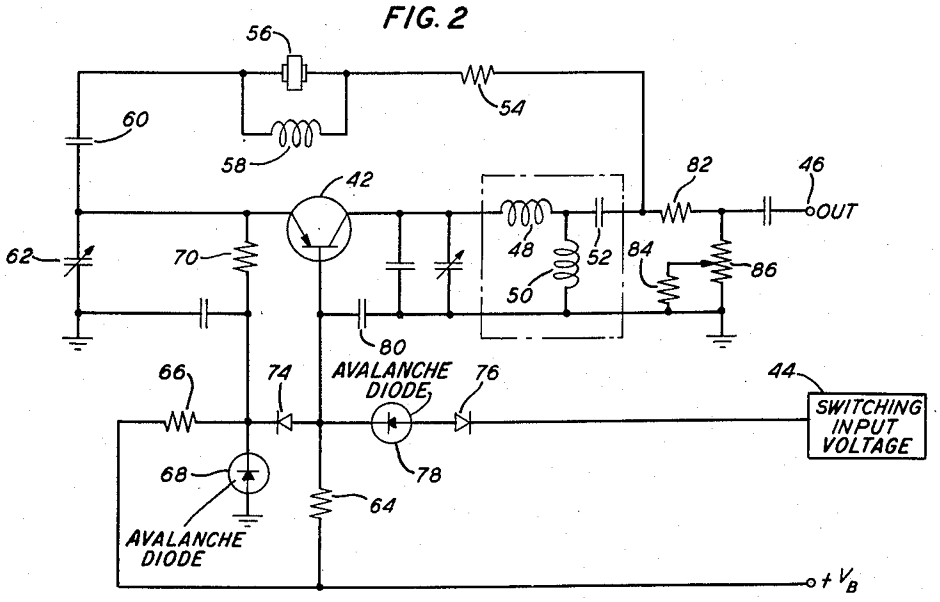

The above and other features of the invention will be considered in detail in the following specification taken in connection with the drawing in which:

Fig. 1 is a schematic circuit diagram of a basic transistor switch according to the invention; and Fig. 2 is a circuit schematic diagram of a transistor oscillator circuit provided with fast turn-on characteristics through the use of the switching circuit of the invention.

As shown in Fig. 1 of the drawing, the basic switch of the invention involves a transistor 10, shown as a p-n-p junction transistor. It will be understood that the p-n-p type transistor is shown as a matter of convenience and that an n-p-n transistor may equally well be employed, providing the various bias and operating voltages of the circuit are appropriately changed.

Transistor 10 is shown in Fig. 1 as connected in the common emitter configuration between a signal input terminal 12 and a signal output terminal 14. Thus the base of transistor 10 is connected to input terminal 12 by way of a coupling capacitor 16 and the collector of the transistor is connected to output terminal 14 by way of an output circuit including a capacitor 18 and an inductor 20. The base of the transistor is connected to the emitter by way of an inductor 22 and a semiconductor diode 24 connected in the forward direction (the direction of easy conduction for a conventional diode). A source of positive potential indicated at $V_B$ is connected by way of a resistor 26 to the point 27 at the junction of inductor 22 and diode 24 and by way of a resistor 28 to the emitter of transistor 10 and provides appropriate operating potentials therefor. The various auxiliary circuits making up the switch will be considered in detail hereinafter.

In addition to the above input and output connections, a switching input terminal 30 is provided and is connected to the junction point 27 by way of a pair of diodes 32 and 34 which are series-connected back-to-back. Diode 32 is a conventional solid-state diode and is connected in the reverse direction or direction of high resistance between the switching input and the aforementioned junction point 27, while diode 34 is a so-called avalanche or breakdown diode of the general type disclosed in Patent 2,714,702 to W. Shockley, August 2, 1955. Such diodes are characterized by having a reverse characteristic which changes abruptly from a high resistance state to a low resistance, substantially constant voltage characteristic at a particular reverse voltage. Such diode elements are often referred to as Zener diodes although the effect referred to above is not believed necessarily to be the same as that discovered by Zener. In any event, diode 34 is connected in the reverse direction between diode 32 and the junction point 27.

A square or stepped-wave switching voltage is provided for application to control terminal 30 and may be varied between a potential of zero corresponding to the On condition of the switch and a potential $V_S$ corresponding to the Off condition. The remaining elements of the circuit of Fig. 1 include a breakdown or avalanche diode 36 connected in the reverse direction between the emitter of transistor 10 and ground, a capacitor 38 bypassing signal frequencies to ground, and a storage capacitor 40 connected between the junction 27 of inductor 22 and resistor 26 and ground.

Potentials $V_S$ and $V_B$ and the breakdown potentials of diodes 34 and 36 must be appropriately chosen having regard to the characteristics of transistor 10 and the desired switching performance. The necessary values for these quantities may best be understood by a consideration of the operation of the basic switch, as above described. It is necessary for the Off condition (that is, the condition in which a signal applied to input terminal 12 is prevented from reaching output terminal 14) that the base of transistor 10 be made more positive than the emitter thereof. Further, as has been set forth above, the switching input voltage for the Off condition is to be a positive potential while the voltage for the On condition is to be zero. The significance of this latter requirement will become apparent hereinafter. In order to meet the two conditions just stated, it is necessary that the potential at the emitter of transistor 10, and thus at one terminal of diode 24, be less than that at point 27 at the junction of inductor 22 and resistor 26 or, stated in another fashion, that the potential applied across diode 24 be in the direction of easy conduction to permit the transfer of current therethrough.

For this purpose, the potential at the emitter of transistor 10 is held fixed through the use of a voltage divider connected between the source $V_B$ and ground and comprising the series combination of resistor 28 and breakdown diode 36. So long as the potential across diode 36 exceeds its breakdown potential, diode 36 will conduct in the reverse direction and a substantially constant voltage will appear at the junction of the divider and thus at the emitter of transistor 10. This potential is made less than that at the junction 27 of inductor 22 and resistor 26 by appropriate choice of resistors 26 and 28, and further, the potential at the last-mentioned junction point is made smaller than the potential $V_S$ applied at the switching input terminal 30 to produce the Off condition of the switch plus the reverse breakdown potential of diode 34. Under these circumstances, the flow of current in the forward direction through diode 24 produces a voltage drop of the proper polarity to bias the base of transistor 10 positively with respect to the emitter and thus to cut off the transistor. The voltage drop across diode 24 limits the base-emitter potential to a safe and stable value. At the same time, by virtue of the fact that either diode 32 is back-biased or breakdown diode 34 is biased in the forward direction, no current is permitted to flow between the switching input and the junction of inductor 22 and resistor 26. Further, because of the manner in which the operating potentials can be arranged, the base is held positive with respect to the collector when the transistor is cut off. This insures that the output impedance of the switch will be very high when in the Off state.

While the switch is in the condition just described, storage capacitor 40 charges from the source at $V_B$ through resistor 26. It is the time constant of the combination including resistor 26 and capacitor 40 which sets and controls the turn-off time of the switch.

When it is desired to switch from the Off to the On condition, in which transistor 10 is unblocked and may transmit amplified signals between input terminal 12 and output terminal 14, the switching voltage $V_S$ is removed from switching input terminal 30 and the potential at this point becomes zero. Under these conditions, the potential at the junction 27 of inductor 22 and resistor 26 exceeds that at switching terminal 30, and diode 32 is forward biased at the same time at which the breakdown potential of breakdown diode 34 is exceeded. A constant voltage drop determined almost entirely by the breakdown potential of breakdown diode 34 occurs and capacitor 40 discharges rapidly through the very low impedance circuit including diodes 32 and 34 and the very low source impedance corresponding to the zero switching voltage. The potential at the junction of inductor 22 and resistor 26 becomes much less than that which existed in the Off state, while the potential at the emitter of transistor 10 remains essentially unchanged. Under these circumstances, which exist transiently, conduction begins in the base-emitter circuit of transistor 10, diode 24 is back-biased and becomes non-conducting, and because of the increased drop in resistor 28, caused by the flow of current through transistor 10, breakdown diode 36 ceases to conduct in the reverse direction.

The fact that the switching voltage required to turn the switch On is zero, combined with the fact that the combination of diodes 32 and 34 provides an extremely low impedance path for the discharge of capacitor 40 and any parasitic capacitances which may exist, provides an extremely fast turn-on time for the switch. In a typical switch in accordance with the invention, turn-on times of one micro-second are easily obtained. A controlled turn-off time of much greater magnitude is easily obtained.

While the basic switch according to the invention has been described in connection with Fig. 1, in its application to a transistor connected in the common emitter configuration, the principles of the invention are equally applicable to transistors connected in other configurations. Fig. 2 illustrates the application of the switching arrangement of the invention to an oscillator which utilizes a transistor connected in the common base configuration as the active element. Here, a p-n-p transistor 42 serves both as an active element of an oscillator circuit and as the switched elemment and the circuit is arranged so that in response to a voltage applied to a switching input terminal 44 and having the same characteristics as the switching signal employed in connection with Fig. 1, the generation of oscillations may be selectively controlled.

In the oscillator circuit, the collector of the transistor is connected to the emitter by way of a feedback circuit including an idealized transformer comprising inductances 48 and 50 and capacitance 52 selected to provide unity coupling when connected in the equivalent T as shown, a resistor 54, a tuned circuit comprising a piezoelectric crystal 56 and a shunting inductance 58, and capacitors 60 and 62. The base of transistor 42 is connected to a source of positive potental, indicated at $+V_B$ by way of a resistor 64.

The switching circuit, by means of which the oscillator is controlled, is substantially identical to that considered in connection with Fig. 1 of the drawing and includes a divider comprising the series connection of a resistor 66 and a breakdown diode 68 connected between the source of positive potential $V_B$ and ground, the junction point of the divider being connected to the emitter of transistor 42 by way of a resistor 70. A diode 74 is connected between the emitter and the junction of resistors 66 and 70 in the forward direction, and switching input terminal 44 is connected to the base of the transistor by way of the series combination of a diode 76 connected in the high resistance or reverse direction and a breakdown diode 78 connected in the forward direction. A bypass capacitor 80, connected between the base of transistor 42 and ground, corresponds to storage capacitor 40 of Fig. 1.

Operation of the switching circuit to turn the oscillator on or off in response to appropriate voltages applied to switching input terminal 44 is the same as that described in connection with the circuit of Fig. 1. It should be noted that fast turn-on of a crystal oscillator is complicated by the high Q of the tuned circuit, including the crystal. Accordingly, resistor 54 is provided in the feedback circuit and serves to reduce the Q of the tuned circuit sufficiently to permit rapid build-up of oscillations in the oscillator circuit. Capacitor 62 serves as a trimmer capacitor and the amplitude of the output appearing at terminal 46 is controlled by the network, including resistors 82 and 84, together with a potentiometer 86.

Turn-on times for the transistor comparable to those mentioned above in connection with the basic switch of Fig. 1 have been obtained in typical circuits. While the oscillator of Fig. 2 constitutes one advantageous application of the switching principles of the invention, it will be understood that the basic switch of the invention is of broad utility and may be used wherever a transmission gate capable of high speed performance is required.

What is claimed is:

1. A switching circuit having a rapid turn-on comprising a transistor having emitter, base, and collector elements connected between input and output circuits with one of its elements common to both input and output circuits, means for applying signals to be switched to an element other than that common to both input and output circuits, means interconnecting said other element and the element common to said input and output circuits to apply a bias therebetween normally preventing the flow of current in said output circuit, a control terminal, a pair of asymmetrically conducting devices one of which has an avalanche breakdown characteristic connected back-to-back between said control terminal and one terminal of said interconnecting means, and means for applying a voltage to said control terminal exceeding the breakdown voltage of said one asymmetrically conducting device to remove said bias from said transistor.

2. A switching circuit having a rapid turn-on and a controlled turn-off comprising a transistor having emitter, collector, and base elements connected in common base configuration, means for applying signals to be switched to said emitter element, an output circuit connected to said collector element, means interconnecting said base and emitter elements to apply a bias therebetween normally preventing current flow in the collector circuit of said transistor, a control terminal, a pair of asymmetrically conducting devices one of which has an avalanche breakdown characteristic connected back-to-back between said base element and said control terminal, and means for applying a voltage to said control terminal exceeding the breakdown voltage of said one asymmetrically conducting device to remove said bias from said transistor.

3. A switching circuit having a rapid turn-on and a controlled turn-off comprising a transistor having emitter, collector, and base elements connected in common emitter configuration, means for applying signals to be switched to said base element, an output circuit connected to said collector element, means interconnecting said base and emitter elements to apply a bias therebetween normally preventing current flow in the collector circuit of said transistor, a control terminal, a pair of asymmetrically conducting devices one of which has an avalanche breakdown characteristic connected back-to-back between said base element and said control terminal, and means for applying a voltage to said control terminal exceeding the breakdown voltage of said one asymmetrically conducting device to remove said bias from said transistor.

4. A switching circuit having a rapid turn-on comprising a transistor having emitter, base, and collector elements connected in circuit between input and output circuits with one of those elements common to both input and output circuits, means for applying signals to be switched to an element other than that common to said input and output circuits, means interconnecting said base and emitter elements to apply a bias therebetween normally preventing the flow of current in the output circuit, a control terminal, a pair of asymmetrically conducting devices one of which has an avalanche breakdown characteristic connected between said control terminal and one terminal of said interconnecting means, and means for applying a control voltage to said control terminal exceeding the breakdown voltage of said one asymmetrically conducting device to remove the bias from said transistor.

5. A switching circuit having a rapid turn-on comprising a transistor having emitter, base, and collector elements connected in circuit between input and output circuits with one of those elements common to both input and output circuits, means for applying signals to be switched to an element other than that common to said input and output circuits, an asymmetrically conducting device connected in the forward conducting direction between the base and emitter of said transistor, means for normally biasing said asymmetrically conducting device to permit the flow of current therethrough, the voltage drop across said asymmetrically conducting device biasing said transistor to prohibit the flow of current in the output circuit, a control terminal, a pair of asymmetrically conducting devices one of which has an avalanche breakdown characteristic connected between said control terminal and the terminal of said first asymmetrically conducting device adjusting the base of said transistor, and means for applying a voltage to said control terminal exceeding the breakdown voltage of said one asymmetrically conducting device to interrupt the flow of current through said one asymmetrically conducting device.

6. A switching circuit having a rapid turn-on comprising a transistor having emitter, base, and collector elements connected in circuit between input and output circuits with one of those elements common to both input and output circuits, means for applying signals to be switched to an element other than that common to said input and output circuits, a diode interconnecting the base and emitter elements of said transistor in the direction of easy conduction from said base to said emitter, a source of positive voltage of a first potential connected to said emitter, a second source of positive potential greater than said first potential connected to the base of said transistor, a control terminal, a pair of asymmetrically conducting devices one of which has an avalanche breakdown characteristic connected between the base of said transistor and said control terminal with said asymmetrically conducting devices back-to-back in series and poled to permit conduction from said second source of potential to the control terminal, and means applying a potential greater than said second potential less the breakdown potential of said avalanche breakdown device to said control terminal normally to prevent conduction through said transistor.

7. A switching circuit having a rapid turn-on comprising a transistor having emitter, base, and collector elements connected in circuit between input and output circuits with one of those elements common to both input and output circuits, means for applying signals to be switched to an element other than that common to said input and output circuits, a diode interconnecting the base and emitter elements of said transistor in the direction of easy conduction from said base to said emitter, a source of positive voltage of a first potential connected to said emitter, a second source of positive potential greater than said first potential connected to the base of said transistor, a control terminal, a pair of asymmetrically conducting devices one of which has an avalanche breakdown characteristic connected between the base of said transistor and said control terminal with said asymmetrically conducting devices back-to-back in series and poled to permit conduction from said second source of potential to the control terminal, means applying a potential greater than said second potential less the breakdown potential of said avalanche breakdown device to said control terminal normally to prevent conduction through said transistor, and means for reducing the potential at the control terminal to a value less than said second potential by an amount sufficient to cause breakdown of said asymmetrically conducting device having said avalanche breakdown characteristic.

8. A switched oscillator circuit having rapid turn-on and comprising a transistor having emitter, base, and collector elements, said transistor being connected in circuit between input and output terminals with one of its elements common to both input and output circuits, a tuned circuit interconnecting said input and output terminals and tuned to resonance at the desired operating frequency for the oscillator, means interconnecting the base and emitter elements of said transistor to apply a bias therebetween normally preventing the flow of current in said tuned circuit, a control terminal, a pair of asymmetrically conducting devices one of which has an avalanche breakdown characteristic connected between said control terminal and one terminal of said interconnecting means, and means for applying a voltage to said control terminal exceeding the breakdown voltage of said one asymmetrically conducting device to remove the cutoff bias from said transistor.

No references cited.